United States Patent
Kumagai et al.

[19]

[11] Patent Number: 6,113,053
[45] Date of Patent: Sep. 5, 2000

[54] ELECTRONIC CHIP COMPONENT FOR MEASUREMENT AND TAPE CARTRIDGE HOLDING THE SAME

[75] Inventors: Yoshimitsu Kumagai; Fumihiko Hikita, both of Kawagoe, Japan

[73] Assignee: Kyoshin Kogyo Co., Ltd., Tokyo, Japan

[21] Appl. No.: 09/111,860

[22] Filed: Jul. 8, 1998

[30] Foreign Application Priority Data

Jan. 16, 1998 [JP] Japan ................................. 10-006797

[51] Int. Cl.$^7$ ............................... B65D 63/00; A47F 1/10; H02G 3/08
[52] U.S. Cl. ........................ 248/499; 248/300; 248/205.1; 228/180.21; 174/263; 174/52.1
[58] Field of Search ..................................... 248/499, 300; 206/328, 332, 331, 334; 174/52.2–52.4, 263; 361/400, 399, 212–220

[56] References Cited

U.S. PATENT DOCUMENTS

| | | | |
|---|---|---|---|
| 2,364,846 | 12/1944 | Hartman | 248/300 |
| 2,609,418 | 9/1952 | Binns et al. | 248/300 |
| 4,558,838 | 12/1985 | Klein | 248/235 |
| 4,859,631 | 8/1989 | Barre | 437/209 |
| 4,903,830 | 2/1990 | Onondera | 206/328 |
| 5,411,236 | 5/1995 | Morita et al. | 248/500 |
| 5,452,743 | 9/1995 | Rortvedt | 137/615 |
| 5,880,405 | 3/1999 | Nakamura et al. | 174/52.1 |

FOREIGN PATENT DOCUMENTS 5-27809  7/1993  Japan .

*Primary Examiner*—Anita M. King
*Assistant Examiner*—Michael Nornberg

[57] ABSTRACT

An electronic chip component for measurement formed by bending a plate material into a structure having an end face substantially in the shape of a square C comprises a cross-link section at the top portion thereof, leg sections formed individually on the opposite sides of the cross-link section, and foot sections formed by individually bending the respective lower end portions of the leg sections inward and each having a bent proximal end and a bent distal end, the respective distal ends of the foot sections facing each other across a space, and an the respective undersurfaces of the foot sections individually constituting joint surfaces to be bonded to the terminal surface, at least the lower parts of the respective outer surfaces of the leg sections and the respective outer surfaces of the foot sections being subjected to surface treatment for soldering.

3 Claims, 4 Drawing Sheets

ELECTRONIC CHIP COMPONENT FOR MEASUREMENT AND TAPE CARTRIDGE HOLDING THE SAME

BACKGROUND OF THE INVENTION

1. Field of the Invention

The present invention relates to an electronic chip component for measurement to be mounted on the surface of a printed board by means of a chip mounter and capable of being engagedly fitted with a measuring probe.

2. Description of the Related Art

Disclosed and described in Jpn. UM Appln. KOKOKU Publication No. 5-27809 is a conventional electronic chip component for measurement, which is mounted on the surface of a printed board and to which a measuring probe can be anchored. This chip component is composed of a metallic plate, one side of which is solderable and the other side of which is not. It is a rectangular tube, as a whole, which is formed by bending the metallic plate so that the surface that is not solderable is inside.

As shown in FIG. 1, more specifically, this chip component 30 is a rectangular tube of stainless steel, which comprises a top section 31 formed of a probe retaining portion, side sections 32 formed of soldering portions, and a bottom section 33 formed of a joint portion to be bonded to the printed board. A slit 33s is formed in the bottom section 33 of the chip component 30, corresponding to the abutting portions of the metallic plate. The inner surface of the chip component 30 is not subjected to surface treatment such as plating, while the outer surface is plated with solder or the like.

In mounting this chip component on the printed board, solder paste is previously applied to predetermined spots on electrodes (lands) of the printed board, and the chip component is placed on the lands by means of a chip mounter. Thereafter, the printed board is heated in a heating oven so that the solder is remelted therein. Soldering is carried out in this mounting position.

Since the outer surface of the conventional chip component is metallized with a solderable metal, solder can easily adhere to the whole outer surface and inevitably cover apertures like snowholes.

Since the whole outer surface of the conventional chip component is solderable, moreover, there is no need of discrimination between the obverse and reverse of the component when the component is mounted on the surface of the printed board. When the chip component, a rectangular tube, is mounted on the printed board, however, the whole base of the chip component inevitably touches the solder paste that is applied to the lands of the board. Accordingly, the pressure from the weight of the chip component that acts on the surface in contact with the printed board is reduced. If the solder is remelted during reflow-soldering process, therefore, the whole chip component floats above the solder.

In this state, the points of application of the surface tension of the solder cannot be settled in specific positions on the base of the chip component. Thus, the irregularity of the surface tension of the solder adhering to the peripheral edge of the chip component acts as a moment around the center of the base of the component. In consequence, the chip component is misoriented over the solder, and may possibly be soldered directly to the printed board.

SUMMARY OF THE INVENTION

An object of the present invention is to provide an electronic chip component for measurement, of which only the base and its surrounding regions can be fixed to lands of a printed board with use of a proper quantity of solder, and which can be properly oriented with respect to the lands as it is mounted on the printed board.

Another object of the invention is to provide an electronic chip component for measurement, capable of being soldered securely to lands of a printed board.

Still another object of the invention is to provide an electronic chip component for measurement, capable of being attracted securely by suction by means of a handling device for surface mounting.

In order to achieve the above objects, an electronic chip component according to the present invention is a chip component formed by bending a plate material into a structure having an end face substantially in the shape of a square C and adapted to be soldered to a terminal surface formed on an electronic circuit substrate. The chip component comprises a cross-link section at a top portion thereof, leg sections formed by bending the end edges of the cross-link section downward and located individually on the opposite sides of the cross-link section, and foot sections formed by individually bending respective lower end portions of the leg sections inward and each having a bent proximal end at the leg section and a bent distal end angularly directed toward the cross-link section, such that each foot section is inclined upward from the bent proximal end to the distal end. The respective distal ends of the foot sections face each other across a space and the respective undersurfaces of the foot sections individually constitute joint surfaces to be bonded to the terminal surface. At least the lower parts of the respective outer surfaces of the leg sections and the respective outer surfaces of the foot sections are subjected to surface treatment for soldering.

During a reflow-soldering process, the outer surfaces of the foot sections and parts of the outer surfaces the leg sections are brought into contact with melted solder. Thus, the respective contact surfaces of the chip component and the melted solder are formed as two spaced contact surfaces. Accordingly, the points of application of the surface tension of the solder are restricted to spots near the opposite end portions of the chip component, so that no moment acts around the center of the chip component even if the level of the surface tension of the solder is subject to variation. In consequence, there is no possibility of the chip component being misoriented while the solder is being melted.

Preferably, each of the foot sections is inclined upward from the bent proximal end to the bent distal end.

According to this preferred arrangement, an appropriate quantity of solder can get into spaces between the joint surfaces outside the foot sections and lands of the substrate. As the confined solder sets up, therefore, the chip component can be bonded more securely to the substrate.

Preferably, moreover, the cross-link section has a broad surface portion.

In taking out the chip component from an embossed carrier tape and mounting it on a printed board, a handling device can securely attract the broad portion of the cross-link section by suction. Thus, there is no possibility of the chip component slipping off the handling device during the mounting operation.

The above and other objects, features, and advantages of the invention will be more apparent from the ensuing detailed description taken in connection with the accompanying drawings.

DETAILED DESCRIPTION OF THE PREFERRED EMBODIMENTS

An electronic chip component for measurement according to one embodiment of the present invention will now be described with reference to the accompanying drawings.

Figure 1:
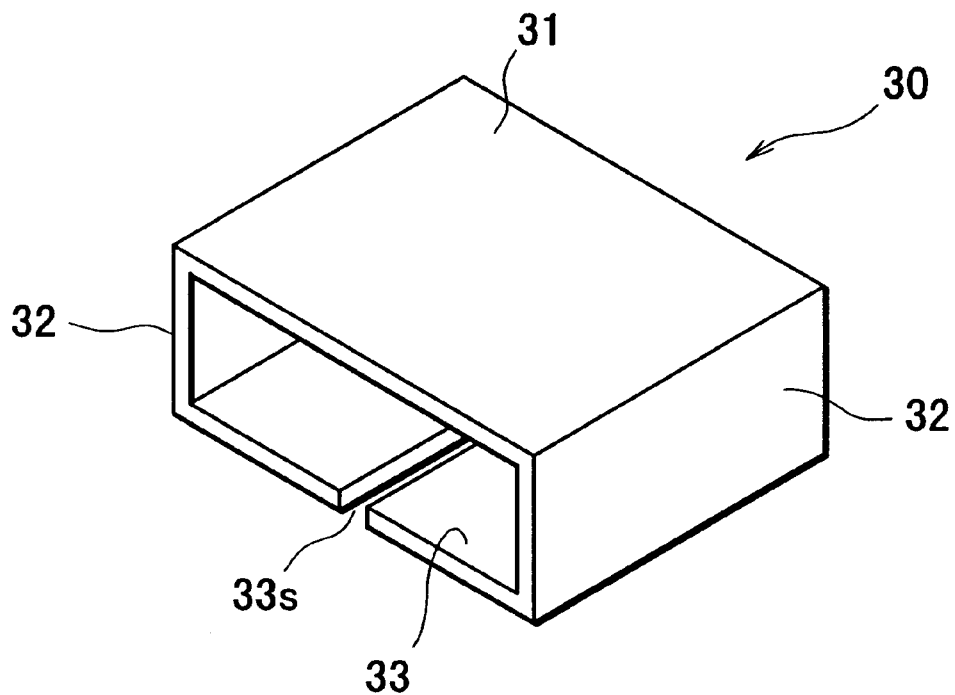
FIG. 1 is a perspective view of a conventional chip component.
Figure 2:
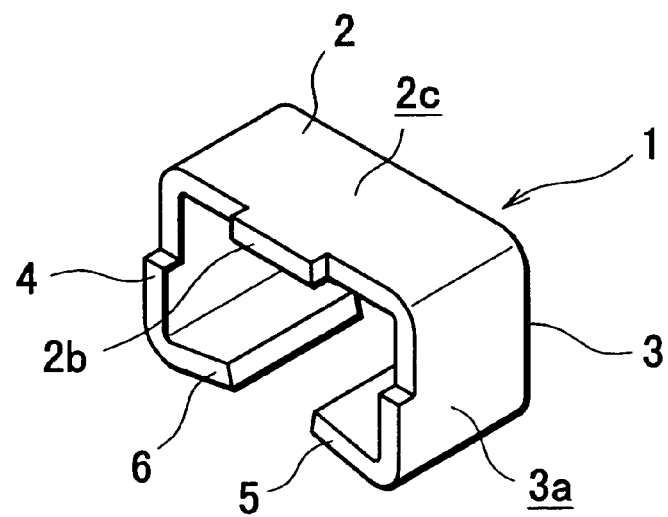
FIG. 2 is a perspective view of a chip component according to one embodiment of the present invention.
Figure 3:
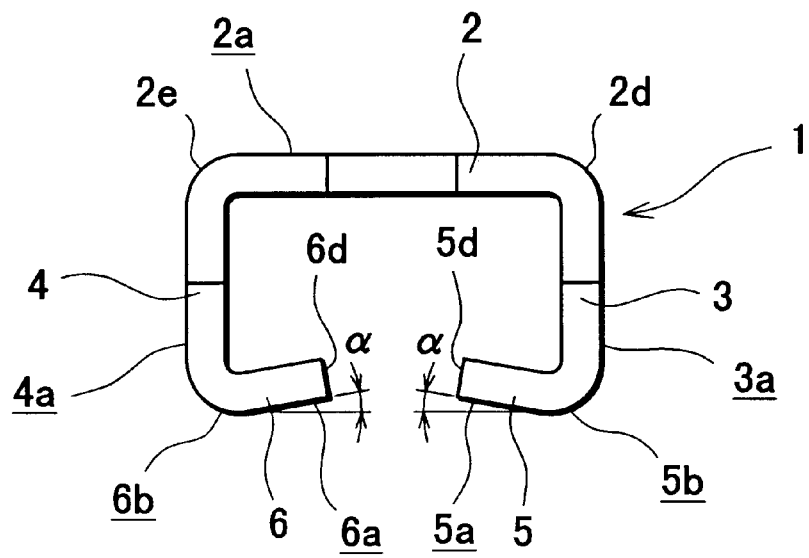
FIG. 3 is a side view of the chip component shown in FIG. 2.

Referring to FIGS. 2 and 3, there is shown an electronic chip component 1 for measurement, which is formed of stainless steel and has an end face substantially in the shape of a square C. The chip component 1 comprises a cross-link section 2 at its top portion, leg sections 3 and 4 formed individually on the end edges of the cross-link section 2, and foot sections 5 and 6 formed on the lower ends of the leg sections 3 and 4, respectively. Further, the respective lower parts of outer surfaces 3a and 4a of the leg sections 3 and 4 and outer surfaces 5a and 6a of the foot sections 5 and 6 are subjected to surface treatment for soldering, such as solder plating. On the other hand, an outer surface 2a of the cross-link section 2 and the entire inner surface of the chip component 1 are not subjected to any surface treatment for soldering, so that stainless steel, which cannot be soldered, is exposed on them.

Figure 4:
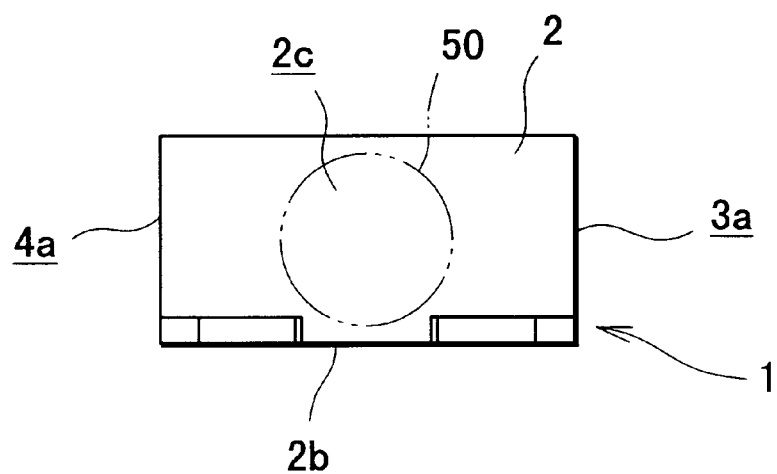
FIG. 4 is a top view of the chip component shown in FIG. 2.

As shown in FIGS. 2 and 4, a lug 2b protrudes flush from the central portion of one side of the cross-link section 2. Thus, a broad surface portion 2c is formed on part of the cross-link section 2. The broad surface portion 2c has an area wide enough to allow a suction pad 50 of a handling device for sucking the chip component 1 to attract the component 1 securely.

The leg sections 3 and 4 extend vertically downward from their corresponding ends of the cross-link section 2. A broad portion is formed under the central portion of each of the leg sections 3 and 4. Each broad portion has a width substantially equal to that of the broad surface portion 2c of the cross-link section 2. The broad portions allow solder to adhere securely to the outer surfaces 3a and 4a of the leg sections 3 and 4.

Probe retaining sections 2d and 2e are formed individually between the broad surface portion 2c of the cross-link section 2 and the respective broad portions of the leg sections 3 and 4.

The foot sections 5 and 6 are bent inward from the lower ends of the leg sections 3 and 4, respectively. As shown in FIG. 3, the foot sections 5 and 6 are inclined upward toward their respective distal ends, that is, toward the cross-link section 2. Thus, the foot sections 5 and 6 are separated wider from their corresponding lands of a substrate as their distal end portions are approached when the chip component 1 is placed on the substrate lands.

Since the foot sections 5 and 6 are formed in this manner, joint surfaces 5a and 6b are also inclined inward or toward the cross-link section 2. An angle a of inclination of the joint surfaces 5a and 6a should only be wide enough to allow a proper quantity of solder to get into spaces between the lands of the substrate and the surfaces 5a and 6a when the solder is melted by heating after the chip component 1 is placed on the substrate lands. Preferably, the angle $\alpha$ ranges from about 5⁻ to 15⁻.

Since the joint surfaces 5a and 6a are thus inclined inward, the chip component 1 is supported on the substrate lands by means of only engaging surfaces 5b and 6b near the respective lower ends of the two leg sections.

End portions 5d and 6d of the foot sections 5 and 6 face each other with a space between them. The foot sections 5 and 6 have an overall length such that the points of application of the surface tension of the solder being melted are restricted to two spots near the opposite end portions of the chip component 1. Moreover, the foot sections 5 and 6 have a length such that the melted solder between the substrate lands and the joint surfaces 5a and 6a sets up to allow the chip component 1 to be bonded firmly to the substrate lands when a reflow-soldering process is carried out with the component 1 tacked to a printed board. Preferably, the overall length of each foot section ranges from about 20% to 40% of that of the chip component 1.

The foot sections 5 and 6 have a width such that the chip component 1 never falls when it is placed on the lands of the substrate by means of a mounter. Preferably, they are as wide as the respective broad portions of the leg sections 3 and 4.

The following is a description of a method for mounting electronic chip components for measurement on the substrate.

Figure 5:
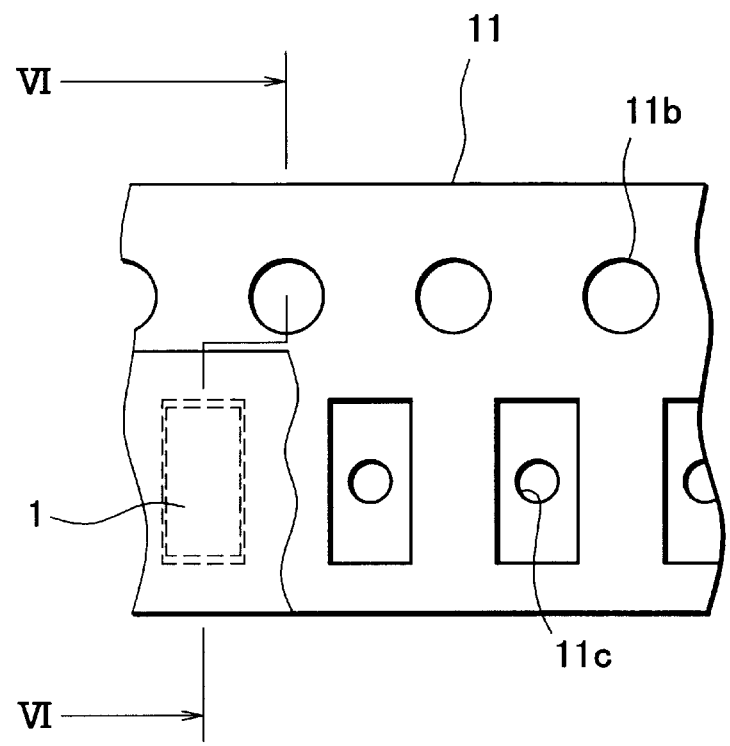
FIG. 5 is a top view showing part of an embossed carrier tape holding the chip component shown in FIG. 2.
Figure 6:
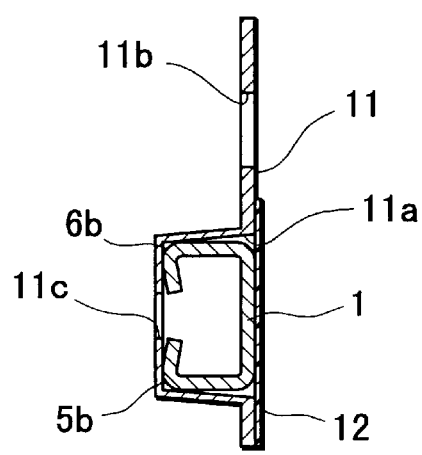
FIG. 6 is a sectional view taken along line VI—VI of FIG. 5.

As shown in FIG. 5, the chip components 1 for measurement are held at regular intervals on an embossed carrier tape (chip component holding tape) 11. Recesses 11a such as the one shown in FIG. 6 are formed at a given space in the tape 11. The chip components 1 are contained individually in the recesses 11a in a manner such that their engaging surfaces 5b and 6b are in contact with the respective bases of their corresponding recesses 11a. Bored through the central portion of the base of each recess 11a is a hole 11c that facilitates the removal of each chip component 1 from the recess 11a.

A protective tape 12 is bonded to the top surface of the embossed carrier tape 11 to cover it, thereby preventing each chip component 1 from slipping off unexpectedly. The outer surface 2a of the cross-link section 2 of the component 1 is substantially flush with the top surface of the carrier tape 11. Thus, the protective tape 12 is bonded not only to the top surface of the tape 11 but also to the outer surface 2a of the cross-link section 2 of the chip component 1, thereby securely holding the component 1 in the recess 11a.

Figure 7:
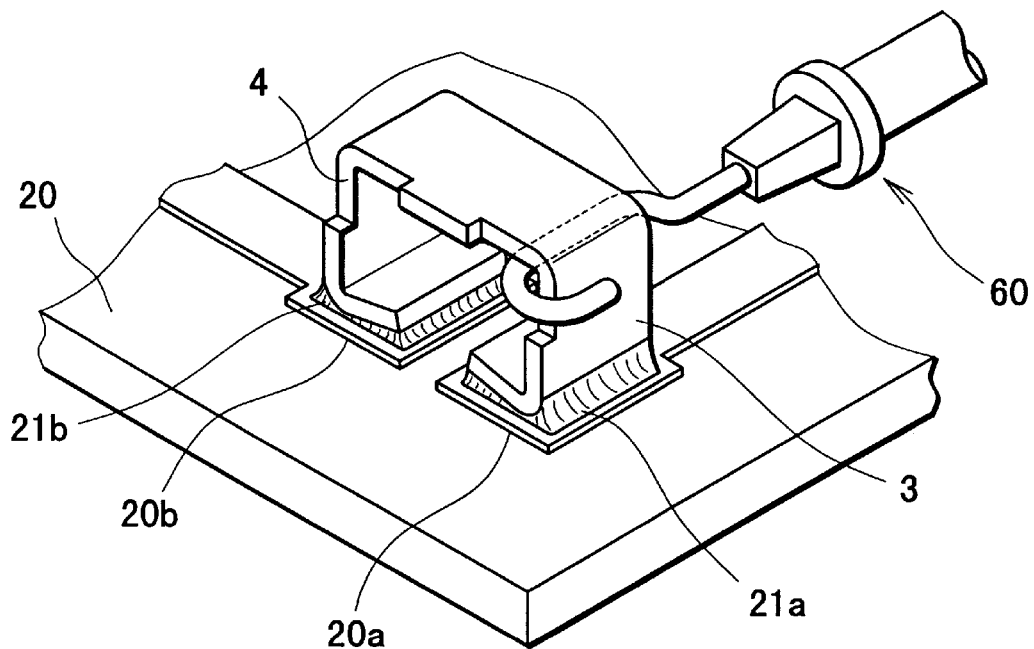
FIG. 7 is a perspective view showing the chip component of FIG. 2 mounted on and soldered to a printed board and engagedly fitted with a measuring probe.

In mounting the chip components 1 on a printed board 20 shown in FIG. 7, a tape cartridge or the embossed carrier tape 11 is attached to an electronic component supply unit (not shown) of the chip mounter. Then, a feed mechanism of the electronic component supply unit is caused to engage a round feed hole 11b of the carrier tape 11. Subsequently, the tape 11 is fed at predetermined pitches. At the same time, the protective tape 12 on the embossed carrier tape 12 is separated as the chip components 1 in the recesses 11a of the tape 11 are taken out one after another. The components 1 are taken out in a manner such that the cross-link section 2 of each chip component 1 is attracted to the handling device (not shown) by suction.

Since the cross-link section 2 is formed having the broad surface portion 2c, each chip component 1 can enjoy a wide suction area. In consequence, the chip component 1 can be securely seized by means of a sucking section 50 of the handling device. Thus, the chip components 1 can be positively prevented from slipping off while they are being mounted on the printed board 20.

Then, each delivered chip component 1 is placed on lands 20a and 20b of the printed board 20. Solder that contains a flux, that is, solder paste, is previously applied to the lands 20a and 20b. Although the lands 20a and 20b formed on the printed board 20 are separated from each other, they need not always be spaced. Alternatively, both the engaging surfaces 5b and 6b of the chip component 1 may be placed on one wider land.

As mentioned before, the width of the foot sections 5 and 6 of the chip component 1 is substantially equal to that of the broad surface portion 2c of the cross-link section 2, that is, the foot sections are wide enough. Accordingly, the chip component 1 can never fall down accidentally while it is being placed on the lands 20a and 20b. In consequence, the chip component 1 can be mounted securely on the lands.

After the chip component 1 is mounted on the printed board 20, the board 20 is heated in a heating oven so that the solder is remelted therein.

Figure 8:
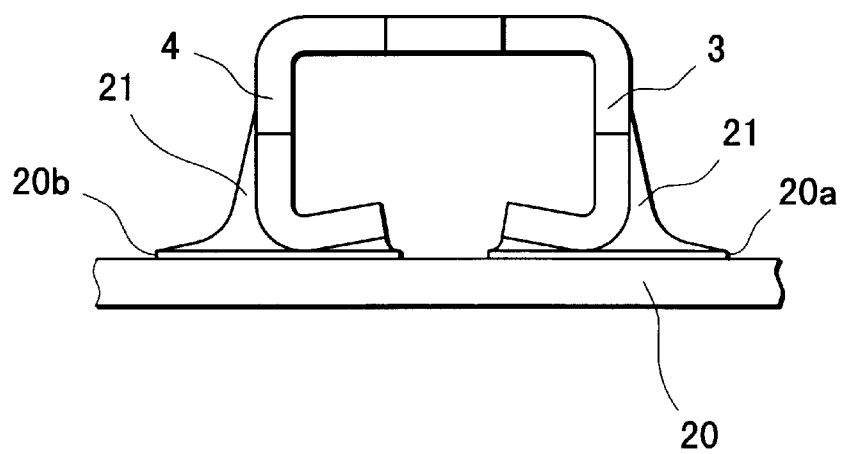
FIG. 8 is a side view showing the chip component of FIG. 2 mounted on and soldered to the printed board.

In this heating process, as shown in FIGS. 7 and 8, solder beads 21a and 21b adhere individually to the outer surfaces 3a and 4a of the leg sections 3 and 4 and the respective peripheral edges of the foot sections 5 and 6, and get into spaces between the joint surfaces 5a and 6a of the chip component 1 and the lands 20a and 20b of the printed board 20.

As the solder beads 21a and 21b melt, as described above, the chip component 1 is mounted on the lands with its opposite end portions floating.

The melted solder beads 21a and 21b apply their respective surface tensions to the joint surfaces 5a and 6a of the chip component 1 and the outer surfaces 3a and 4a of the leg sections. The points of application of these surface tensions are restricted to two spots near the opposite end portions of the component 1. Unlike conventional chip components, therefore, the chip component 1 can never be subjected to the surface tensions of the solder as a moment around its center with its base floating entire over the solder. Accordingly, there is no possibility of the chip component 1 being misoriented while the solder is being melted.

Subsequently, the solder beads adhering to the outer surfaces 3a and 4a of the leg sections 3 and 4 and the peripheral edges of the foot sections 5 and 6 set up, so that the chip component 1 is fixed to the lands 20a and 20b.

At the same time, the solder beads between the joint surfaces 5a and 6a of the chip component 1 and the lands 20a and 20b of the substrate 20 also set up. Thus, the chip component 1 can be bonded firmly to the lands 20a and 20b of the substrate 20.

Alternatively, the foot sections 5 and 6 may be designed so that their respective joint surfaces 5a and 6a come entirely into contact with their corresponding lands 20a and 20b of the printed board 20. According to the embodiment described above, however, the solder beads between the joint surfaces 5a and 6a and the lands 20a and 20b can be set up by inclining the joint surfaces 5a and 6a inward and toward the cross-link section 2. In consequence, the chip component 1 can be bonded more firmly to the lands 20a and 20b.

Alternatively, moreover, a lug may be provided on either side of the cross-link section 2 so that the cross-link section has a broad portion with a greater area. According to this arrangement, the chip component 1 can be attracted more easily by suction.

Further, the chip component 1 may be subjected to surface treatment such that its entire outer surface can be soldered. Preferably, however, this surface treatment should be restricted to the partial outer surfaces 3a and 4a of the leg sections 3 and 4 and the outer surfaces 5a and 6a of the foot sections 5 and 6, as in the case of the foregoing embodiment. Since the solder beads 21 never adhere to undesired regions, they can be prevented from adhering like snowholes to the inner peripheral surface of the chip component 1. Thus, a measuring probe 60 can be easily anchored to the component 1 after the soldering.

According to the embodiment described above, the chip component 1 mounted on the printed board 20 is subjected to reflow-soldering. However, the present invention may be also applied to the case where an operator solders the chip component 1 to the printed board 20 by means of a soldering iron or the like.

Although specific forms or embodiments of the present invention have been shown and described herein, it is to be understood that various changes and modifications may be effected by one skilled in the art without departing from the scope or spirit of the invention.

What is claimed is:

1. An electronic chip component for measurement formed by bending a plate material into a structure having an end face substantially in the shape of a square C and adapted to be soldered to a terminal surface formed on an electronic circuit substrate, comprising:

a cross-link section at a top portion thereof;

leg sections formed by bending the end edges of the cross-link section downward and located individually on the opposite sides of the cross-link section; and foot sections formed by individually bending respective lower end portions of the leg sections inward and each having a bent proximal end at the leg section and a distal end, the respective distal ends of the foot sections facing each other across a space, and respective undersurfaces of the foot sections individually constituting joint surfaces to be bonded to the terminal surface, each said foot section being inclined upward from the bent proximal end to the distal end, only the lower parts of respective outer surfaces of the leg sections and respective outer surfaces of the foot sections being subjected to surface treatment for soldering to thereby preclude twisting moments about a central region of the component due to surface tension from solder.

2. The electronic chip component for measurement according to claim 1, wherein said cross-link section has a broad surface portion.

3. In combination a chip component tape cartridge for holding a plurality of electronic chip components at predetermined intervals, and electronic chip components, each chip component comprising:

a plate structure having an end face substantially in the shape of a square C and adapted to be soldered to a terminal surface formed on an electronic circuit substrate including, a cross-link section at a top portion thereof;

leg sections formed by bending the end edges of the cross-link section downward and located individually on the opposite sides of the cross-link section; and foot sections formed by individually bending respective lower end portions of the leg sections inward and each having a bent proximal end at the leg section and a distal end, the respective distal ends of the foot sections facing each other across a space, and respective undersurfaces of the foot sections individually constituting joint surfaces to be bonded to the terminal surface each said foot section being inclined upward from the bent proximal end to the bent distal end, only the lower parts of respective outer surfaces of the leg sections and respective outer surfaces of the foot sections being subjected to surface treatment for soldering to thereby preclude twisting moments about a central region of the component due to surface tension from solder.

* * * * *